(12) United States Patent
Forrest et al.

(10) Patent No.: US 7,242,703 B2
(45) Date of Patent: Jul. 10, 2007

(54) ORGANIC INJECTION LASER

(75) Inventors: Stephen Forrest, Princeton, NJ (US);
Vinod Menon, Princeton, NJ (US);
Zoltan Soos, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 252 days.

(21) Appl. No.: 11/016,740

(22) Filed: Dec. 21, 2004

(65) Prior Publication Data

US 2006/0133437 A1    Jun. 22, 2006

(51) Int. Cl.
*H01S 3/14* (2006.01)
*H01L 29/08* (2006.01)

(52) U.S. Cl. .................... 372/39; 372/50.124; 257/40
(58) Field of Classification Search ............... 372/39, 372/50.124; 257/40
See application file for complete search history.

(56) References Cited

U.S. PATENT DOCUMENTS

| | | | | |
|---|---|---|---|---|
| 5,294,810 A * | 3/1994 | Egusa et al. ................... 257/40 |
| 5,682,402 A * | 10/1997 | Nakayama et al. ........... 372/99 |
| 5,881,089 A | 3/1999 | Berggren et al. |
| 6,160,828 A * | 12/2000 | Kozlov et al. ................ 372/39 |
| 6,498,802 B1 * | 12/2002 | Chu et al. ..................... 372/39 |
| 6,593,589 B1 * | 7/2003 | Osinski et al. ................ 257/22 |
| 6,639,357 B1 * | 10/2003 | Parthasarathy et al. ..... 313/504 |
| 6,687,274 B2 * | 2/2004 | Kahen .......................... 372/39 |
| 6,728,278 B2 * | 4/2004 | Kahen et al. ................. 372/39 |
| 6,756,732 B1 * | 6/2004 | Kawase ....................... 313/504 |
| 6,806,491 B2 * | 10/2004 | Qiu et al. ..................... 257/40 |
| 6,818,329 B1 * | 11/2004 | Liao et al. ................... 428/690 |
| 6,853,660 B2 * | 2/2005 | Spoonhower et al. ......... 372/39 |
| 6,870,868 B2 * | 3/2005 | Kahen et al. ................. 372/39 |
| 6,875,320 B2 * | 4/2005 | Raychaudhuri et al. ..................... 204/192.12 |
| 6,885,025 B2 * | 4/2005 | Tung et al. ................... 257/40 |
| 7,011,897 B2 * | 3/2006 | Thompson et al. ......... 428/690 |
| 7,034,454 B2 * | 4/2006 | Kawai et al. ................ 313/504 |
| 7,045,952 B2 * | 5/2006 | Lu ............................... 313/504 |
| 7,132,174 B2 * | 11/2006 | Wang et al. ................. 428/690 |
| 2003/0038287 A1 * | 2/2003 | Suzuki et al. ................. 257/40 |
| 2003/0103537 A1 | 6/2003 | Yoshio et al. |
| 2004/0038075 A1 * | 2/2004 | Wang et al. ................. 428/690 |
| 2004/0066824 A1 * | 4/2004 | Magno et al. ................ 372/50 |
| 2004/0069995 A1 * | 4/2004 | Magno et al. ................ 257/80 |
| 2004/0150330 A1 * | 8/2004 | Suh ............................. 313/506 |

(Continued)

OTHER PUBLICATIONS

C. Adachi, et al., "Architectures for Efficient Electrophosphorescent Organic Light-Emitting Devices", IEEE Journal on Selected Topics in Quantum Electronics, vol. 8, No. 2, pp. 372-377, Mar./Apr. 2002.

(Continued)

*Primary Examiner*—Minsun Oh Harvey
*Assistant Examiner*—Phillip Nguyen
(74) *Attorney, Agent, or Firm*—Kenyon & Kenyon LLP

(57) ABSTRACT

An unipolar organic injection laser in which electrically-stimulated intraband transitions result in lasing. An active region includes at least one organic injector layer and at least one organic emitter layer. Each organic emitter layer has a first energy level and a second energy level on a same side of an energy gap defined by a conduction band and a valance band. Charge carriers are injected through the organic injector layer into the first energy level of the organic emitter layer when a voltage is applied across active region. The difference in energy between the first and second energy levels produces radiative emissions when charge carriers transition from the first energy level to the second energy level. Population inversion is maintained between the first and second energy levels, producing stimulated emission and lasing.

22 Claims, 4 Drawing Sheets

U.S. PATENT DOCUMENTS

| | | | |
|---|---|---|---|
| 2004/0239237 A1* | 12/2004 | Matsusue et al. | 313/504 |
| 2005/0006642 A1* | 1/2005 | Tung et al. | 257/40 |
| 2005/0110007 A1* | 5/2005 | Forrest et al. | 257/40 |
| 2005/0158523 A1* | 7/2005 | Gupta et al. | 428/195.1 |
| 2005/0211974 A1* | 9/2005 | Thompson et al. | 257/40 |

OTHER PUBLICATIONS

R. Paiella, et al., "Generation and Detection of High-Speed Pulses of Mid-Infrared Radiation with Intersubband Semiconductor Lasers and Detectors", IEEE Transactions on Photonics Technology Letters, vol. 12, No. 7, pp. 780-782, Jul. 2000.

G. Scamarcio, et al., "Status and Recent Advances in Quantum Cascade Lasers", The 16th Annual Meeting of the IEEE Lasers and Electro-Optics Society, 2003. LEOS 2003. Oct. 27-28, 2003, vol. 1, pp. 350-351.

C. Sirtori, "Recent Progress on Quantum Cascade Lasers", IEEE 18th International Semiconductor Laser Conference, 2002. Sep. 29-Oct. 3, 2002, pp. 3-4.

F. Capasso, et al., "New Frontiers in Quantum Cascase Lasers and Applications", IEEE Journal on Selected Topics in Quantum Electronics, vol. 6, No. 6, pp. 931-947, Nov./Dec. 2000.

T. Knödl, et al., "Multistage Bipolar Cascade Vertical-Cavity Surface-Emitting Lasers: Theory and Experiment", IEEE Journal of Selected Topics in Quantum Electronics, vol. 9, No. 5, pp. 1406-1414, Sep./Oct. 2003.

C. Gmachl, et al., "Bi-directionally functional semiconductor laser", Summaries of Papers Presented at the Conference on Lasers and Electro-Optics, 1999, CLEO '99, May 23-28, 1999, Baltimore, MD.

Y. Hong, et al., "Opto-Electronic Properties of Poly (Fluorene) Co-Polymer Red Light-Emitting Devices on Flexible Plastic Substrate", IEEE Transactions on Electron Devices, vol. 51, No. 10, pp. 1562-1569, Oct. 2004.

V.G. Kozlov, et al., "Laser action in organic semiconductor waveguide and double-heterstructure devices", Nature, vol. 389, pp. 362-364, (Sep. 1997).

V.G. Kozlov, et al., "Temperature independent performance of organic semiconducotr lasers", Appl. Phys. Lett. 71 (18), pp. 2575-2577 (Nov. 3, 1997).

M.A. Baldo, et al., "Prospects for electrically pumped organic lasers", Phys. Rev. B 66, pp. 035321-1-035321-16 (2002).

J. Faist, et al., "Quantum Cascade Laser", Science, vol. 264, pp. 553-556 (Apr. 22, 1994).

J. Faist, et al., "Laser action by tuning the oscillator strength", Nature, vol. 387, pp. 777-782 (Jun. 19, 1997).

C. Gmachl, et al., "Ultra-broadband semiconductor laser", Nature, vol. 415, pp. 883-887 (Feb. 21, 2002).

P. Peumans, et al., "Efficient, high-bandwidth organic multilayer photodetectors", Appl. Phys. Lett., vol. 76, No. 26, pp. 3855-3857, (Jun. 26, 2000).

S.V. Shevyakov, et al., "Orbital Control of the Color and Excited State Properties of Formylated and Fluorinated Derivatives of Azulene", J. Phys. Chem. A 2003, 107, pp. 3295-3299.

P. Foggi et al., "S1—Sn and S2 Absorption of Azulene: Femtosecond Transient Spectra and Excited State Calculations", J. Phys. Chem. A 2003, 107, 1689-1696.

V.G. Kozlov et al., "Low Threshold, High Peak Power Organic Semiconductor Lasers", Conf. on Lasers and Electro-optics CLEO '97, CPD-18, Opt. Soc. Am., Baltimore, MD, May 1997.

V. G. Kozlov, et al., "Unique optical properties of organic semiconductor lasers," presented at CLEO '98, San Francisco, May 3-8, 1998.

V. G. Kozlov, et al., "Structures for Organic Diode Lasers and Optical Properties of Organic Semiconductors Under Intense Optical and Electrical Excitations," IEEE J. Quant. Electron., vol. 36, No. 1, pp. 18-26, Jan. 2000.

* cited by examiner

ORGANIC INJECTION LASER

GOVERNMENT RIGHTS

This invention was made with U.S. Government support under Contract No. 3396002 awarded by the United States Air Force Office of Scientific Research. The U.S. Government has certain rights in this invention.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic lasers. More specifically, the present invention is directed to an organic injection laser that is electrically pumped.

BACKGROUND

The past fifteen years have seen an explosive growth of research interest in the study and application of organic materials as the active media in organic opto-electronic devices. This work has resulted in several advances, such as organic light emitting devices (OLEDs), including phosphorescent OLEDs. Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate.

Inorganic unipolar lasers are known, such as quantum cascade lasers (QCL). QCL differ fundamentally from the usual semiconductor heterostructure laser in that QCL devices are unipolar. In a unipolar quantum device, an electron or hole transition generating a photon is between sub-band energy levels within a same band (i.e., an intraband transition). Since the first experimental demonstration of an inorganic QCL device, Faist et al., Science 264, 553 (1994), progress has been made in understanding the physics and technological applications of such devices. Faist et al, Nature 387, 777; Gmachl et al., Nature 415, 883 (2002), Paiella et al., IEEE Photon. Tech. Lett. 12, 780 (2000). However, QCL may not enjoy many of the benefits of organic devices, such as low cost and tunability of energy levels at the molecular level.

SUMMARY OF THE INVENTION

A unipolar organic injection laser in which electrically-stimulated intraband transitions result in lasing. An active region includes at least one organic injector layer and at least one organic emitter layer. Each organic emitter layer has a first energy level and a second energy level on a same side of an energy gap defined by a conduction band and a valance band. Charge carriers are injected through the organic injector layer into the first energy level of the organic emitter layer when a voltage is applied across active region. The difference in energy between the first and second energy levels produces radiative emissions when charge carriers transition from the first energy level to the second energy level. Population inversion is maintained between the first and second energy levels, producing stimulated emission and lasing.

DETAILED DESCRIPTION

Figure 1A:
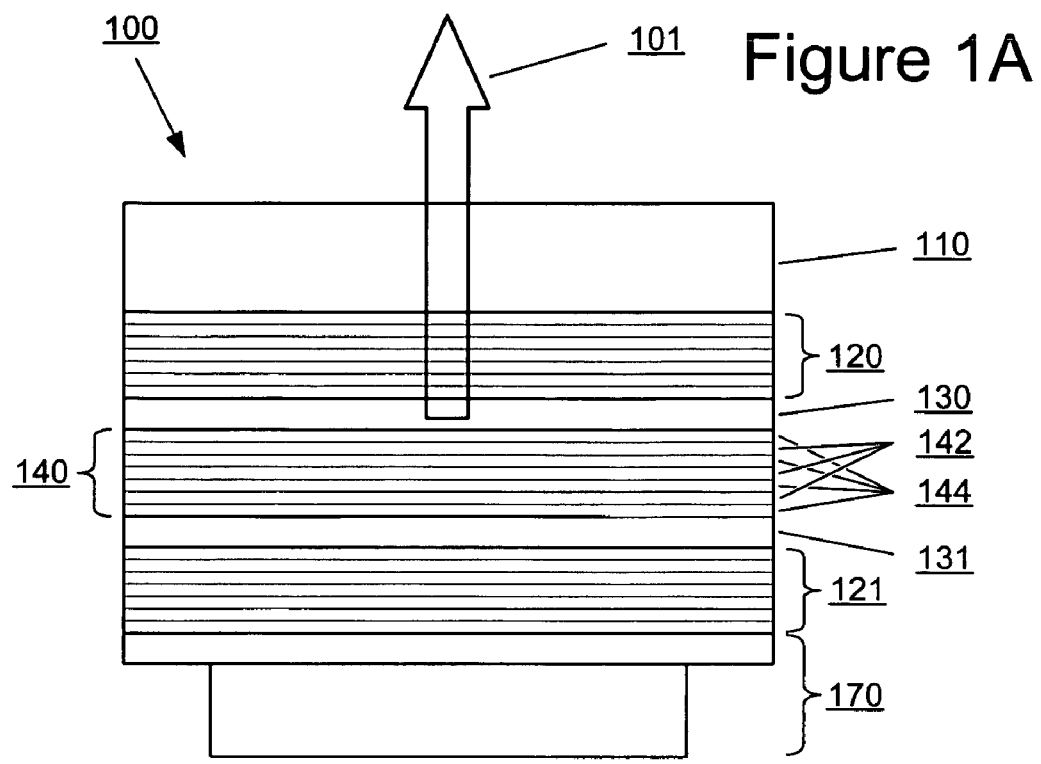
FIGS. 1A and 1B are cross-sections of an example of an organic vertical-cavity surface-emitting laser (VCSEL).

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram (as used herein), with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule.

Over the past 3 decades, many organic materials have been shown to exhibit laser emission when optically pumped. Liquid dye lasers based on molecular materials have been used over this same period, and in 1997 lasing from an optically pumped organic semiconductor thin films was demonstrated. Koslov et al., Nature 389, 362 (1997). Lasing action has been demonstrated in an organic laser having optically-pumped slab waveguide structures of vacuum-deposited thin films of small molecular weight organic semiconductors. V. G. Kozlov et al., Conf. on Lasers and Electro-optics CLEO '97, CPD-18, Opt. Soc. Am., Baltimore, Md., May 1997. Lasing from molecular organic as well as polymeric thin films has been shown to span the visible spectrum, extending into the near IR simply by making modifications to the lasing medium. V. G. Kozlov, V. Bulovic, P. E. Burrows, V. Khalfin, and S. R. Forrest, "Unique optical properties of organic lasers," presented at CLEO '98, San Francisco, 1998.

There are several advantages to using organic materials (including both small molecule and polymer materials) as lasing media: the linewidths are extremely narrow, the lasing wavelength is tunable by chemically modifying the lasing species, and the lasing wavelength is independent of temperature over wide ranges. Kosloz et al., Appl. Phys. Lett. 71, 2575 (1997). Hence, organic lasers not only serve as probes of the fundamental optical and electronic properties of this highly diverse materials system, but there are also practical applications of such devices as wavelength standards for photonic systems and optical telemetry. For example, the temperature dependence of a DCM2 doped $Alq_3$ optically pumped organic thin film laser may be compared to a GaAs-based laser. The threshold for optically pumped lasing, as well as the lasing wavelength of a molecular organic thin film as a function of temperature show minimal temperature dependence, in contrast to a conventional GaAs-based laser. The almost complete lack of change in these parameters (including slope efficiency) may be due to the isolated, quantum nature of the excited state in organic thin films. These molecular states are largely isolated from those of the environment, leading to lack of sharing of electrons in broad energy bands as occurs in inorganic semiconductors.

The conventional techniques applied to achieving electrically induced laser emission in inorganic semiconductors, such as the use of an intensely pumped double heterostructure, may not be suited for the successfully generation of the laser emission in organic semiconductors. In organic materials, losses related to thin film resistance, polaron quenching, and absorption, and singlet exciton annihilation are factors that inhibit an organic thin film from reaching the lasing threshold by conventional approaches. M. A. Baldo, R. J. Holmes, and S. R. Forrest, "Prospects for electrically pumped organic lasers," Phys. Rev. B, vol. 66, pp. 035321, 2002; V. G. Kozlov, G. Parthasarathy, P. E. Burrows, V. B. Khalfin, J. Wang, S. Y. Chou, and S. R. Forrest, "Structures for Organic Diode Lasers and Optical Properties of Organic Semiconductors Under Intense Optical and Electrical Excitations," IEEE J. Quant. Electron., vol. 36, pp. 18, 2000.

While optically pumping to achieve lasing is relatively straightforward, lasing by electrical injection for organic materials has also been long sought, yet has not been successful to date. There may be fundamental reasons why electrical injection in conventional laser-type structures are difficult to achieve in organic materials. The reports of Schon, et al., from Bell Labs motivated an in depth study of lasing by electrical injection. Baldo et al., Phys Rev. B 66, pp. 035321 (2002). The analysis indicated that polariton (i.e. charge)-excision and bimolecular exciton processes may ultimately prevent lasing from occurring in an organic heterostructure where excitons are first created, followed by radiative recombination in a resonant cavity. That is, the process of luminescence may be fundamentally different in organic semiconductors, compared to inorganic semiconductors, since in the former case formation of tightly bound excitons are a necessary intermediate state in the conventional photogeneration process.

Embodiments of the present invention consider a completely different approach—to achieve lasing by electrical injection in organic materials. Under this approach, the exciton formation involved in conventional organic luminescence is undesirable, and is circumvented. Rather, luminescence occurs through an intramolecular process of injected carrier energy transitions. Such a device may be referred to as a unipolar organic injection laser (UPOIL), whereby intraband electronic transitions result in lasing. In organic materials, rather large energy gaps existing between the lowest unoccupied molecular orbitals (LUMOs) or highest occupied molecular orbitals (HOMOs) of dissimilar organic materials may be exploited to achieve such radiative transitions.

The primary advantage of unipolar devices is the absence of carrier-carrier recombination and carrier-carrier annihilation scattering mechanisms. Other advantages include the ability of introducing multitude of subsequent optical transitions in the current path traveled by the carrier between the contacts.

There are also disadvantages to unipolar optical transitions, primarily related to the absence of a complete energy gap between consecutive energy levels or sub-bands, which allows additional nonradiative scattering mechanisms with large k-vector exchange. Population inversion in unipolar lasers is achieved by tailoring carrier transport between individual energy levels or sub-bands and locations in the crystal thus concentrating carriers in an energetically higher energy band, while quickly depopulating a lower energy level, with which the original level shares an optical dipole allowed transition. The best means of achieving population in this way is by tailoring transport properties of the structure; i.e. by efficiently injection through resonant tunneling of carriers exclusively in the upper energy level, while providing a resonant scattering mechanism for carriers out of the lower energy level. Indeed, any transport related imbalance of carrier densities that lead to population inversion is suitable.

Organic molecular semiconductors provide opportunities for unipolar optical devices due to the relative ease with which heterostructures can be fabricated from vastly different materials. Furthermore, these heterostructures present a large variety of band alignments, type-I, type-II, and broken-gap from which a suitable organic unipolar injection laser can be built. The successful selection of materials for an organic UPOIL depends on identifying organic materials with interface processing techniques that lead to an appropriate match of molecular level energies between layers. Specifically, energy match is required for injection of the electron (hole) from the injector LUMO (HOMO) into the LUMO+1 (HOMO−1) level of the emitting molecule, and extraction of the electron (hole) from the LUMO (HOMO) of the emitting layer, following radiative intramolecular relaxation, through a thin tunneling barrier into the energy building collector/injector.

Materials described in the examples herein may be used to achieve emission at about 1 eV, but the concept may readily be expanded to other materials and energies. With a UPOIL, only a single carrier transition (not involving the intermediate formation of excitons) is required to generate light in an optical cavity. Due to competition with intramolecular vibronic modes, it is expected that low temperature emission may be achieved with looser criteria, but that lasing action at room temperature may also be achieved. It is expected that lasing in the near IR or even in the visible red spectral region may be achieved at room temperature more readily than other wavelengths.

FIG. 1A shows an example of an organic VCSEL 100. The figures are not necessarily drawn to scale. Device 100 comprises a resonator formed between distributed Bragg reflectors (DBRs) 120 and 121. The conductive substrate 110 serves as a first electrode, and a second electrode 170 is formed on the opposite side of the resonator. In the specific structure of FIG. 1A, the DBR 120 and DBR 121 are conductive.

The active region 140 includes at least one organic emitter layer 142 and at least one organic injection layer 144. On opposite sides of the active region 140 are electron and hole charge transport layers 130 and 131. As will be discussed further below, the transport layers are selected to transport the charge carriers to the active region at a sufficient energy to facilitate injection into the emitter layer.

As is known in the conventional laser art, a length of the resonator may be set to optimize constructive interference at a wavelength emitted by the active region. One DBR 121 is optimized to reflect as much of the resonant wavelength as possible, whereas the other DBR 120 is partially reflective, but allows transmission (101) of some of the resonant wavelength.

Figure 1B:
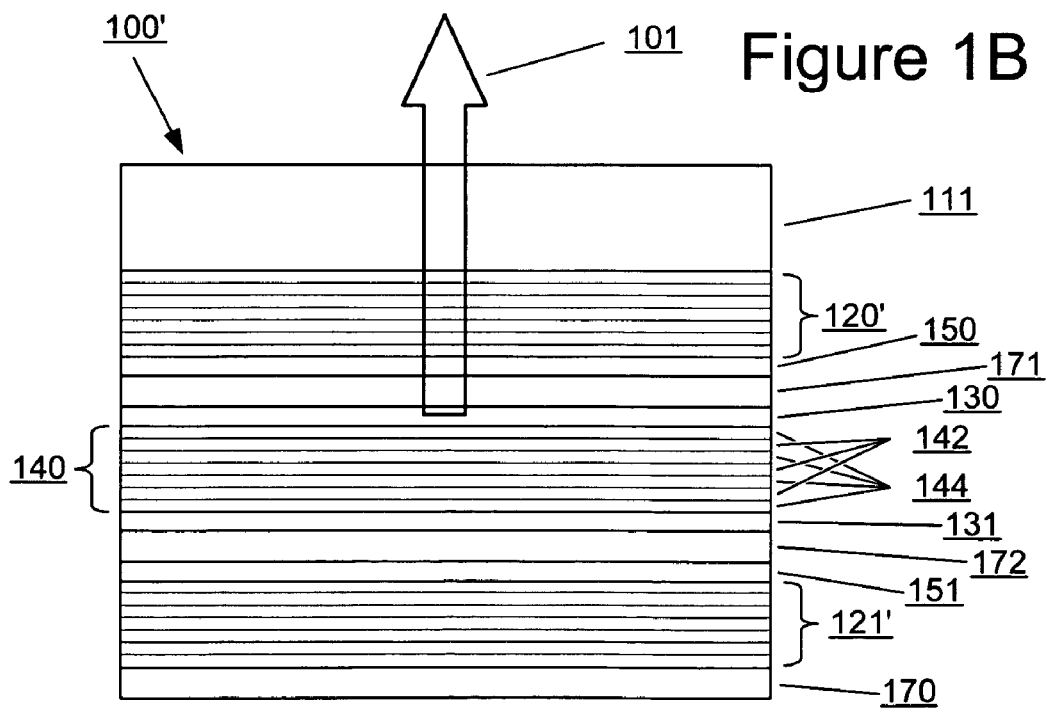

FIG. 1B illustrates another example of an organic VCSEL 100'. In this embodiment, the DBRs 120' and 121' are non-conductive. Transparent electrodes 171 and 172 (e.g., ITO) are placed inside the resonant cavity, between the DBRs and the active region 140. Also illustrated are a non-conductive substrate 111, buffer or spacer layers 150 and 151, and a capping layer 170.

The features of the embodiments in FIGS. 1A and 1B may also be combined. For example, if the DBR is conductive but the substrate is non-conductive, a transparent electrode may be placed between the DBR and the substrate.

In general, the substrates 110/111 may be rigid, flexible, transmissive, opaque, or reflective. "Transmissive" as used herein indicates that light of the wavelengths emitted by the structure is transmitted through the substrate material without substantial loss of amplitude. Glass, plastic and quartz are examples of substrate materials. If the substrate is opaque or reflective, a hole or opening may be etched into the substrate to provide a path for light transmission. The material and thickness of substrate 110/111 may be chosen to obtain desired structural, thermal, and optical properties.

Distributed Braggs reflectors are periodic structures made up of two materials having different refractive indices, and may be conductive or non-conductive. Example materials for DBR layers include $TiO_2/SiO_2$ multilayer stacks, although other DBR materials may be used. The DBR layers may be fabricated, for example, by sputter deposition or plasma deposition, and monitored in situ using ellipsometry as they are deposited. As another example, dielectric materials used as DBR layers may be deposited by thermal evaporation. The reflective layers may be designed with the typical DBR requirement in mind, namely that the thickness of each dielectric layer be equal to the wavelength of light to be reflected divided by 4 times the index of refraction of the dielectric material at said wavelength (wavelength/(4× n)).

The optical length of the resonant microcavity should be equal to an integer number of half wavelengths (m×wavelength/2) of the light to be confined (where m is an integer and the wavelength is that of the light in the material). Additionally, a photon of the relevant wavelength should experience no net phase shift upon a round trip through the cavity at resonance.

Devices 100/100' may include other structures. A dielectric spacer layer may be included as a means to reduce damage to the polariton DBR stack from the deposition of the organic active region stack 140. A dielectric spacer may also be formed between the one or more of the carrier injection layers 130/131 and the transparent electrodes 171/172. Additionally, the dielectric spacer may function as a means of tuning the outcoupling properties of the active region into the polariton DBR stack. If included in the optical path, the dielectric spacer layer must be transparent to the resonant wavelength light emitted from the active region. Materials which may be appropriate for use in the dielectric spacer include silicon oxide, silicon nitride, lithium fluoride, tellurium oxide, and titanium oxide.

Techniques for depositing the materials used in the embodiments of the present invention are well known in the art. For example, a method of depositing organic layers is by thermal evaporation; a method of depositing metal layers is by thermal or electron-beam evaporation; a method of depositing indium-tin-oxide (ITO) (a transparent electrode material) is by electron-beam evaporation or sputtering. However, the present invention contemplates the use of any suitable method of depositing layers of material.

As an example, a first DBR is grown onto a glass substrate. The DBR may be fabricated by sputter deposition or plasma deposition, and monitored in situ using ellipsometry as the layers are deposited. Next, a device as described with respect to FIG. 3–6, and having transparent electrodes, is fabricated over the first DBR.

Figure 2:
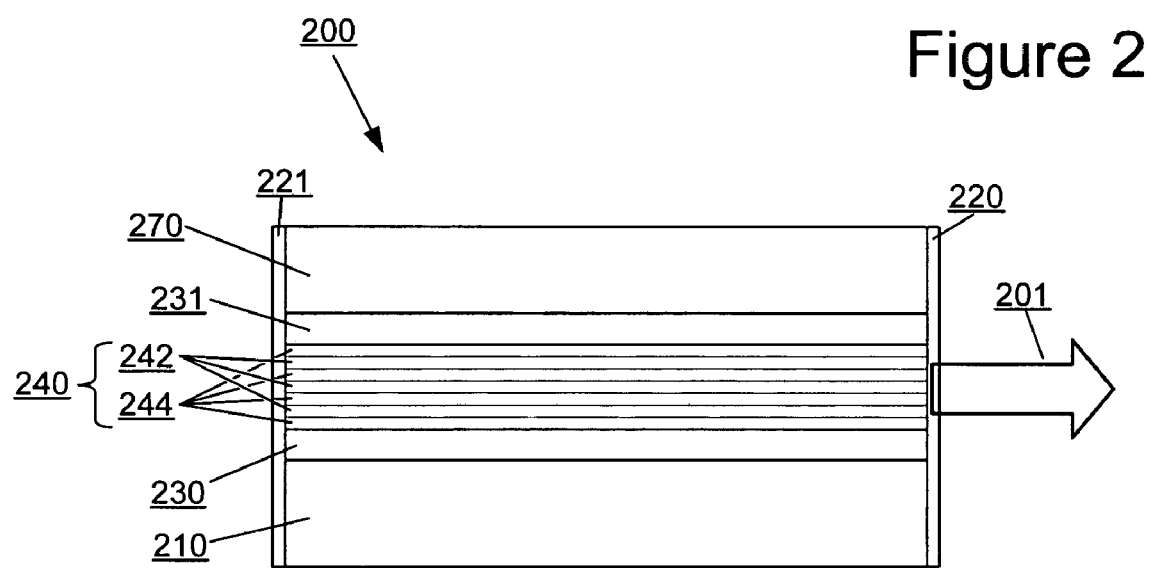
FIG. 2 is a cross-section of an example of an organic broad area laser.

FIG. 2 is an example of a broad area laser 200, including electrodes 210 and 270, charge transport layers 230 and 231, and an active region 240 comprising organic emitter layers 242 and organic injector layers 244. Reflectors 220 and 221 are included at each end of the resonator, with a radiative output 201. Methods and materials as described for the embodiment in FIGS. 1A and 1B may also be used in this embodiment. Further, as is known in the art, the broad area laser may utilize a variety of structures such as a stripe geometry to promote carrier and/or optical confinement, or a distributed feedback structure to promote a single optical mode and/or tune the resonant wavelength. As an example of the broad area laser, the active region operates in accordance with the principles described in FIGS. 3–6.

While FIGS. 1A, 1B, and 2 illustrate specific examples of resonant structures, it is understood that a wide variety of resonant structures are known to the art and may be used in connection with embodiments of the invention. For example, a partially reflective layer may be made of a reflective material with a hole therein. Reflective (or partially reflective) layers may be internal or external. Other variations known to the art may also be used.

In another embodiment, a non-resonant device may be fabricated, which differs from the resonant device in that there in not necessarily a resonant cavity. Without resonance, there is no strong angular dependence of the emitted light; hence the simple Lambertian pattern of a standard OLED. Such a device is different from a standard OLED, however, in that the light emission of a standard OLED is generally understood to result from the radiative decay of an exciton, whereas embodiments of the present invention rely upon an intra-band transition (i.e., a transition within the conduction or valence band, that does not involve a charge carrier crossing the band gap).

Narrow bands (<1 eV) in organic materials may lead to charges that are largely localized on individual molecules. Hence the proposed lasing is from an intraband transition of the radical ion M⁻ (i.e. the LUMO of the neutral molecule now is approximately at the same energy as the HOMO of the radical anion), which is usually at lower energy than the corresponding transition of M, and is related to its LUMO+1 to LUMO transition. Injection is to an excited state, either (M⁻)* or (M+)*. The efficiency of this step depends on proper alignment of energy levels in heterojunctions. Superlattice minibands between hererojunctions, as used in quantum cascade lasers, have not yet been realized using organic materials. As an alternative, films with progressively lower electrons affinities can be used to raise the energy of M⁻ before the next active region. Moreover, since band-like hole transport has been demonstrated in high purity organics such as tetracene, pentancene or rubrene at low temperature, the applied potential also facilitates charge injection directly into the excited state (M⁻)* in the next active region.

Figure 3:
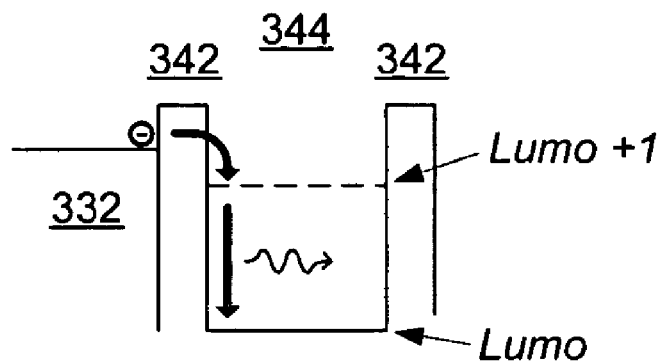
FIG. 3 is an energy band diagram illustrating an intraband transition of an electron generating a radiative emission.

A laser is considered a UPOIL if light is emitted from a transition of a charge carrier within the conduction band or within the valence band, without the charge carrier crossing the band gap. FIG. 3 shows an energy level diagram for a single emitter period of a UPOIL utilizing an intraband transition of an electron. The layers include a carrier transport layer 332, a first injection layer 342, a first emitter layer 344, a second injection layer 342. A photon is emitted as a result of a transition of an electron from the LUMO +1 energy level of an emitter to the LUMO energy level of the emitter. Electrons are injected into the UPOIL from the carrier transport layer 332 into the emitter layer 344 by tunneling through the injection layer 342. We have studied tunneling in such heterostructures grown in our laboratory by the ultrahigh vacuum process of organic molecular beam deposition (OMBD), and find that this can be an efficient mechanism for charge transport for organic layers less than 30 Angstroms thick.

The transition from LUMO+1 to LUMO should be very rapid, because the LUMO ("lowest unoccupied molecular orbital"), by definition, has a large number of available sites for the electron. This rapid transition is in contrast to light emission based on an electron moving from a LUMO energy level to a HOMO energy level, which generally requires the electron to first pair with a hole to form an exciton, in order to provide a vacant state in the HOMO energy level to which the electron can move.

As one embodiment exhibiting the LUMO+1 to LUMO transition in the emitter layers, the LUMO energy level of the injector layer is not more than 0.2 eV less than the LUMO+1 energy level of the emitter layer into which the injector layer is injecting. The energy barrier resulting from not more than 0.2 eV less is small enough that it is not expected to have a significant adverse effect on device performance. As another embodiment, the LUMO energy level of the injector layer is not less than the LUMO+1 energy level of the emitter layer. If the LUMO energy level of the injector layer is not less than the LUMO+1 energy level of the emitter layer, an electron can readily move from the injector layer into the LUMO+1 energy level of the emitter layer. However, even if the LUMO energy level of the injector layer is slightly less than the LUMO+1 energy level of the emitter layer, an electron can still make the transition to the LUMO+1 energy level of the emitter layer, particularly under an applied voltage bias.

An example of materials having suitable energy levels for LUMO+1 to LUMO energy level emission in a UPOIL are BCP (bathocuproine) for the injector layers and azulene ($C_{10}H_8$) for the emitter layers. BCP has a LUMO energy level of −3.2 eV. Azulene, an isomer of naphthalene, is among the organic molecules that emit from $S_2$, or LUMO+1, and its $S_1$ has an unusually low energy. The quantum yield for the $S_2$ to $S_0$ is ~0.046, that for $S_2$ to $S_1$ is ~4×10⁻⁶ and $S_1$ to $S_0$ is <10⁻⁶. The $S_1$ decays nonradiatively through vibronic transitions to $S_0$ with decay times ~1.7 ps. The HOMO, LUMO and LUMO+1 energies are 7.4 eV, 5.64 eV, and 3.9 eV.

Bathocuproine (BCP) has a wide energy gap and works well as a barrier material. Many hole-transport materials and some electron-transport material have also been identified for OLEDs and thin-film-transistors. They are candidates for the transport layers and may involve band transport at low temperature. The active layer for localized holes is a donor D whose cation radical $D^+$ fluoresces in the 1–2 eV range or, for electrons, an acceptor with fluorescent $A^-$. Accordingly, as embodiments of the invention, the energy difference between the LUMO+1 and LUMO energy levels of the emitter layer, and/or between the HOMO−1 and HOMO energy levels of the emitter layer, is 1 to 2 eV.

There is additional flexibility on considering emission from organic salts. Material pairs having a suitable relationship between the LUMO energy level of the injector layer and the LUMO+1 energy level of the emitter layer may have a large difference in their LUMO energy levels. As an example of an embodiment, the LUMO energy level of the injector layer is at least 1.0 eV greater than the LUMO energy level of the emitter layer.

Figure 4:
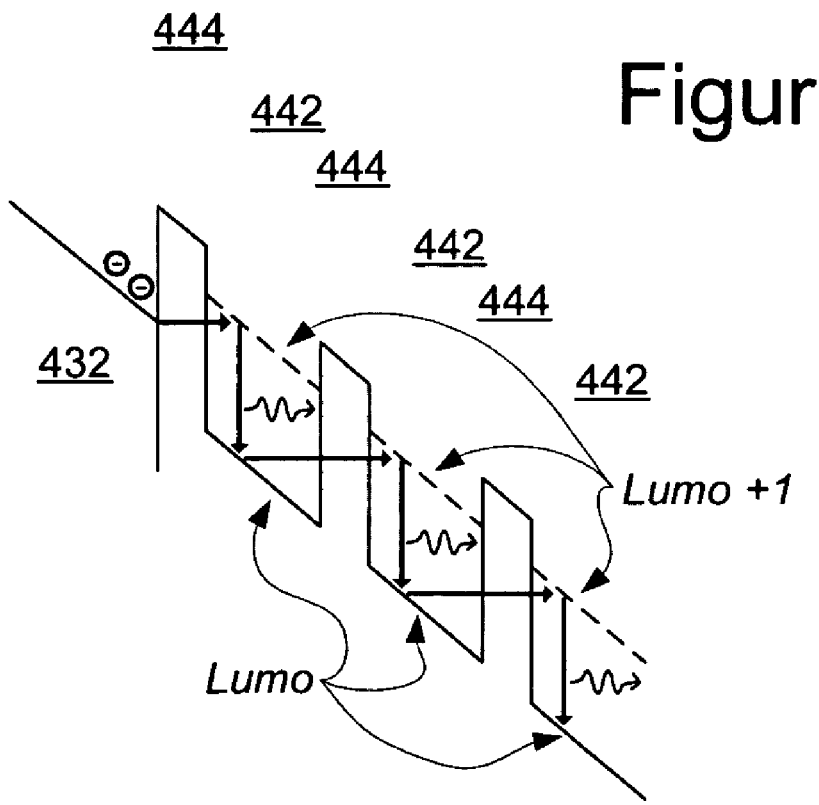
FIG. 4 is an energy band diagram illustrating a path of an electron through a series of organic emitters under bias.

Multiple periods of the same structure may be repeated to enhance photon emission and to introduce gain as needed in a laser structure. For example, FIG. 4 shows multiple emitters under bias. An electron is injected from a charge transport layer 432, tunneling though barrier 444 into emitter layer 442. As the electron decays in each emitter from LUMO+1 to LUMO, a photon is emitted.

Figure 5:
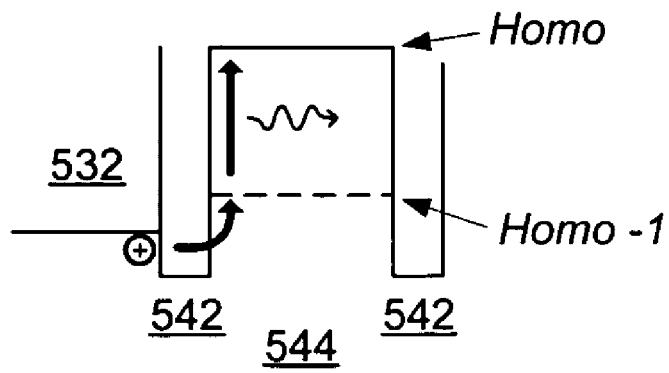
FIG. 5 is an energy band diagram illustrating an intraband transition of a hole generating a radiative emission.

FIG. 5 illustrates the same principles of the invention, but for holes. A hole is injected from carrier transport layer 532 through barrier 542 into emitter 544, where the hole decays from HOMO−1 to HOMO, emitting a photon. The transition from HOMO−1 to HOMO should be very rapid, because the HOMO ("highest occupied molecular orbital"), by definition, has a large number of electrons available to drop into a vacant HOMO−1 site. This rapid transition is in contrast to light emission based on an electron moving from a LUMO energy level to a HOMO energy level, which generally requires the electron to first pair with a hole to form an exciton, in order to provide an electron in the LUMO energy level to fill the vacancy of the hole in the HOMO energy level. Examples of organic injector layers include copper (II) phthalocyanine (CuPc) and Zinc phthalocyanine (ZnPc).

Figure 6:
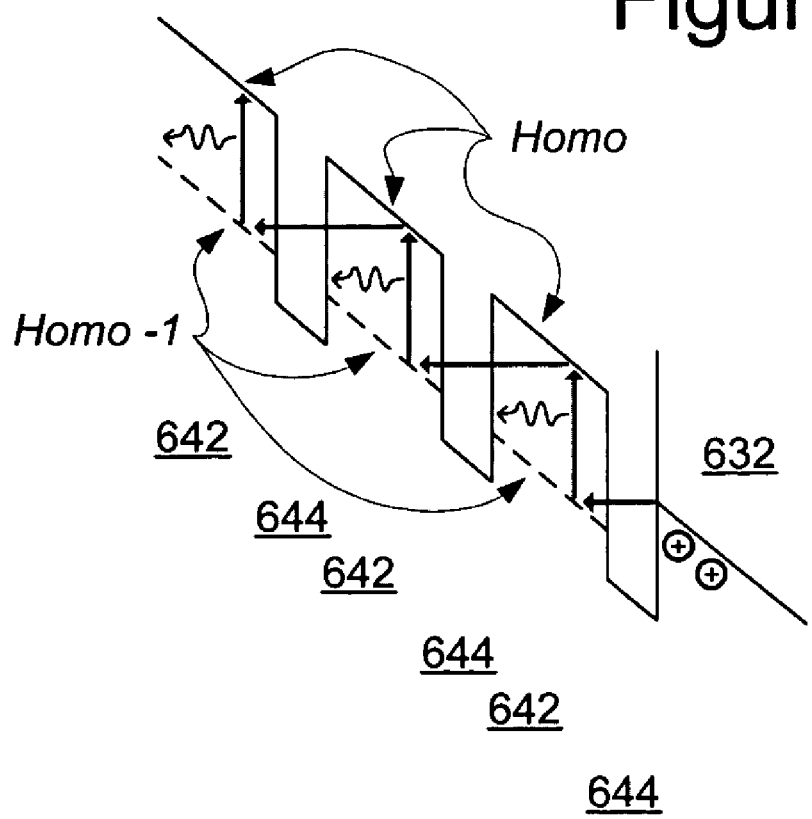
FIG. 6 is an energy band diagram illustrating a path of a hole through a series of organic emitters under bias.

FIG. 6 illustrated multiple periods of hole transitions in emitters under bias. A hole is injected from a charge transport layer 632 into emitter 642, tunneling through barrier 644. Each time the hole transitions from HOMO−1 to HOMO, a photon is emitted. The process is then repeated with respect to subsequent emitter layers and injection layers.

Embodiments exhibiting the HOMO−1 to HOMO transition in the emitter layers are similar to those described with respect to the conduction band energy levels between LUMO and LUMO+1. As an embodiment, the HOMO energy level of the injector layer is not more than 0.2 eV greater than the HOMO−1 energy level of the emitter layer into which the injector layer is injecting. An another embodiment, the HOMO energy level of the injector layer is not less than the HOMO−1 energy level of the emitter layer. If the HOMO energy level of the injector layer is not less than the HOMO−1 energy level of the emitter layer, a hole can readily move from the injector layer into the HOMO−1 energy level of the emitter layer. However, even if the HOMO energy level of the injector layer is slightly less than the HOMO−1 energy level of the emitter layer, a hole can still make the transition to the HOMO−1 energy level of the emitter layer under an applied voltage bias.

If a device is designed to have the same energy level spacing at each stage (each emitter layer has the same LUMO+1 to LUMO energy level difference, or HOMO−1 to HOMO energy level difference), then the photons will all be at the same energy.

The transport layers 332, 432, 532, and 632 may be films of neutral molecules or materials, although ions in organic salts may also be used.

Devices fabricated in accordance with embodiments of the invention may be incorporated into a wide variety of consumer products, including communications devices, printers, etching systems, measuring devices, optical memory devices, display devices, and sensor devices. The devices of the invention may also be employed as wavelength references for wavelength division multiplexing, optical heterodyning and optical clock applications. Embodiments described herein may be fabricated for operation in a temperature range comfortable to humans, such as 18 degrees C. to 30 degrees C., and at room temperature (20–25 degrees C.).

It is understood that the various embodiments described herein are by way of example only, and are not intended to limit the scope of the invention. For example, many of the materials and structures described herein may be substituted with other materials and structures without deviating from the spirit of the invention. As another example, the photon-generating intraband transition could be between other sub-bands, such as LUMO+2 to LUMO+1, or HOMO−2 to HOMO−1. It is understood that various theories as to why the invention works are not intended to be limiting.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A device, comprising:
    a first electrode;
    second electrode;
    a resonator comprising a first reflector and a second reflector;
    an active region disposed in the resonator and electrically connected between the first electrode and the second electrode, the active region comprising:
        an organic emitter layer having a first energy level and a second energy level on a same side of an energy gap defined by a conduction band and a valance band; and
        an organic injector layer in direct contact with the organic emitter layer,
    wherein, if a voltage is applied across the first electrode and the second electrode, charge carriers transition from the first energy level to the second energy level to produce radiative emissions.

2. The device of claim 1, wherein said first energy level is LUMO+1 and said second energy level is LUMO.

3. The device of claim 2, wherein LUMO of the organic injector layer is not more than 0.2 eV less than LUMO+1 of the organic emitter layer.

4. The device of claim 2, wherein LUMO of the organic injector layer is not less than LUMO+1 of the organic emitter layer.

5. The device of claim 2, wherein the organic injector layer comprises BCP and the emitter layer comprises azulene.

6. The device of claim 1, wherein said first energy level is HOMO−1 and said second energy level is HOMO.

7. The device of claim 6, wherein HOMO of the organic injector layer is not more than 0.2 eV greater than HOMO−1 of the organic emitter layer.

8. The device of claim 6, wherein HOMO of the organic injector layer is not greater than HOMO−1 of the organic emitter layer.

9. The device of claim 6, wherein HOMO of the organic injector layer is at least 1.0 eV less than HOMO of the organic emitter layer.

10. The device of claim 9, wherein the organic injector layer is selected from the group consisting of copper (II) phthalocyanine (CuPc) and Zinc phthalocyanine (ZnPc).

11. The device of claim 6, wherein the difference in energy between HOMO−1 and HOMO of the organic emitter layer is 1 to 2 eV.

12. The device of claim 1,
    wherein the first reflector and the second reflector are reflective at a wavelength of radiative emissions to be produced when charge carriers transition from the first energy level to the second energy level, the first and second reflectors to feed back into the active region at least some of the radiative emissions.

13. The device of claim 1, wherein the device is a vertical-cavity surface-emitting laser (VCSEL).

14. The device of claim 13, wherein the first and second reflectors are distributed-Bragg reflectors (DBRs).

15. The device of claim 13, wherein the first electrode is between the first reflector and the active region.

16. The device of claim 13, wherein the first reflector is between the first electrode and the active region.

17. The device of claim 1, wherein the device is a broad-area laser.

18. The device of claim 1, wherein the organic injector layer comprises organic molecules having an energy gap that in an unbiased-state overlaps said first energy level, said second energy level, and at least a portion of the energy gap of the organic emitter layer.

19. The device of claim 18, wherein charge carriers tunnel through the organic injector layer to be injected into the first energy level of the organic emitter layer if a voltage is applied across the first and second electrodes.

20. The device of claim 18, wherein the organic injector layer is less than 30 Angstroms thick.

21. The device of claim 1, wherein the charge carriers are injected through the organic injector layer into the first energy level of the organic emitter layer if a voltage is applied across the first and second electrodes.

22. The device of claim 1, the active region further comprising at least an additional organic emitter layer and at least an additional organic injector layer, the organic emitter layers and the organic injector layers being arranged in a repeating sequence.

* * * * *

UNITED STATES PATENT AND TRADEMARK OFFICE
CERTIFICATE OF CORRECTION

PATENT NO. : 7,242,703 B2 Page 1 of 1
APPLICATION NO. : 11/016740
DATED : July 10, 2007
INVENTOR(S) : Forrest et al.

It is certified that error appears in the above-identified patent and that said Letters Patent is hereby corrected as shown below:

Column 1, line 6, please change "3396002" to --FA9550-04-1-0120--.

Signed and Sealed this

Thirteenth Day of November, 2007

JON W. DUDAS
*Director of the United States Patent and Trademark Office*